(12) United States Patent
Saito et al.

(10) Patent No.: US 8,760,881 B2
(45) Date of Patent: Jun. 24, 2014

(54) PLUG-IN UNIT

(75) Inventors: Osamu Saito, Kawasaki (JP); Hideaki Matsumoto, Yokohama (JP); Mitsuaki Hayashi, Kawasaki (JP); Kenji Joko, Yokohama (JP); Minoru Fujii, Kawasaki (JP); Takaharu Izuno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 142 days.

(21) Appl. No.: 13/449,926

(22) Filed: Apr. 18, 2012

(65) Prior Publication Data

US 2013/0003327 A1 Jan. 3, 2013

(30) Foreign Application Priority Data

Jun. 28, 2011 (JP) ................... 2011-143186

(51) Int. Cl.
*H05K 5/00* (2006.01)

(52) U.S. Cl.
USPC ...... 361/756; 361/679.01; 361/748; 361/752; 361/801

(58) Field of Classification Search
USPC ......... 361/759, 796, 801, 802, 727, 756, 785, 361/728, 736, 740, 788, 748, 752; 211/41.17
See application file for complete search history.

(56) References Cited

U.S. PATENT DOCUMENTS

| 5,103,378 | A | * | 4/1992 | Stowers et al. | 361/802 |
|---|---|---|---|---|---|
| 5,396,401 | A | * | 3/1995 | Nemoz | 361/690 |
| 5,432,682 | A | * | 7/1995 | Giehl et al. | 361/796 |
| 5,657,204 | A | * | 8/1997 | Hunt | 361/752 |
| 5,796,583 | A | * | 8/1998 | Gale et al. | 361/704 |
| 5,868,585 | A | * | 2/1999 | Barthel et al. | 439/377 |
| 5,882,220 | A | * | 3/1999 | Horii et al. | 439/297 |
| 5,967,824 | A | * | 10/1999 | Neal et al. | 439/342 |
| 6,033,254 | A | * | 3/2000 | Neal et al. | 439/377 |
| 6,148,506 | A | * | 11/2000 | Vermette | 29/758 |
| 6,269,006 | B1 | * | 7/2001 | Treiber et al. | 361/756 |
| 6,275,385 | B1 | * | 8/2001 | Sahara et al. | 361/752 |
| 6,288,902 | B1 | * | 9/2001 | Kim et al. | 361/725 |
| 6,288,911 | B1 | * | 9/2001 | Aoki et al. | 361/801 |
| 6,398,042 | B1 | * | 6/2002 | Tabuchi | 211/41.17 |
| 6,421,252 | B1 | * | 7/2002 | White et al. | 361/797 |
| 6,480,390 | B2 | * | 11/2002 | Matsumiya et al. | 361/736 |
| 6,545,611 | B2 | * | 4/2003 | Hayashi et al. | 340/686.4 |
| 6,930,892 | B2 | * | 8/2005 | Barringer et al. | 361/801 |
| 6,976,859 | B2 | * | 12/2005 | Blackwell | 439/157 |
| 7,004,780 | B1 | * | 2/2006 | Wang | 439/353 |
| 7,070,425 | B2 | * | 7/2006 | Regen et al. | 439/131 |
| 7,215,556 | B2 | * | 5/2007 | Wrycraft | 361/802 |
| 7,307,849 | B2 | * | 12/2007 | Ho et al. | 361/737 |
| 7,307,851 | B2 | * | 12/2007 | Dimarco | 361/753 |

(Continued)

FOREIGN PATENT DOCUMENTS

| JP | 2-168696 | 6/1990 |
|---|---|---|
| JP | 2006-216908 | 8/2006 |

*Primary Examiner* — Lisa Lea Edmonds
*Assistant Examiner* — Keith Depew
(74) *Attorney, Agent, or Firm* — Staas & Halsey LLP

(57) ABSTRACT

A plug-in unit includes: a printed circuit board on which a connector is mounted; and a cover in which the printed circuit board is accommodated; wherein the cover allows the connector to be exposed when the plug-in unit is inserted into a housing and to be covered when the plug-in unit is in a standalone state in which the plug-in unit is not inserted into the housing.

3 Claims, 25 Drawing Sheets

(56) References Cited

U.S. PATENT DOCUMENTS

| | | | |
|---|---|---|---|
| 7,364,447 B1* | 4/2008 | Desrosiers et al. | 439/157 |
| 7,535,730 B2* | 5/2009 | Junkins et al. | 361/801 |
| 7,558,069 B2* | 7/2009 | Chung | 361/737 |
| 7,684,210 B2* | 3/2010 | Kosugi et al. | 361/801 |
| 7,746,665 B2* | 6/2010 | Junkins et al. | 361/801 |
| 7,990,726 B2* | 8/2011 | Izuhara et al. | 361/732 |
| 2005/0287853 A1* | 12/2005 | Kim et al. | 439/137 |
| 2010/0124831 A1* | 5/2010 | Chou et al. | 439/131 |
| 2011/0013354 A1* | 1/2011 | Huang | 361/679.31 |

* cited by examiner

PLUG-IN UNIT

CROSS-REFERENCE TO RELATED APPLICATION

This application is based upon and claims the benefit of priority of the prior Japanese Patent Application No. JP2011-143186, filed on Jun. 28, 2011 the entire contents of which are incorporated herein by reference.

FIELD

The embodiment discussed herein is related to a plug-in unit mounted in a housing.

BACKGROUND

A plug-in unit (PIU) is a printed wiring board unit including a printed wiring board (PWB), which is a printed circuit board on which electronic parts are mounted, and connectors.

A connector mounted on the PWB is shaped so as to protrude from an end of the PWB so that the connector fits to a connector on a back board, which is a wiring board in the housing. When the connector is mounted on the PWB, the connector is generally often connected by a method called press-fit connection.

In press-fit connection, a connector terminal is press-fitted into a through-hole formed in a PWB, the connector terminal being wider than the diameter of the through-hole, so that the connector pin and through-hole are deformed so as to mechanically interconnect the PWB and the connector pin to obtain electrical connection.

Although strength in press-fit connection is weaker than in solder connection, all terminals of a connector can be press-fitted concurrently during the mounting of the connector on a PWB, making press-fit connection more mainstream than solder connection.

To meet users' demand concerning handling, it is desirable for the plug-in unit to withstand an impact when it is dropped alone. In drop evaluation carried out before the plug-in unit is shipped, therefore, it is desirable for the connectors and connected parts between the PWB and the connectors to be free from mechanical damage and to cause no deterioration in electric characteristics when the plug-in unit is dropped from a predetermined height.

A printed wiring board is proposed that uses an elasticity holding member to alleviate impact. (See Japanese Laid-open Patent Publication No. 2006-216908, for example.)

As the capacity and speed of transmission over communication networks have been increased in recent years, plug-in units including a large and heavy communication module that can handle a large amount of signals are being increasingly used.

This type of communication module consumes a large amount of electric power because it processes high-speed signals, so a large heat sink that cools the communication module is often mounted on the plug-in unit.

Thus, the plug-in unit tends to become heavy, leading to the fear that when the plug-in unit drops, connector parts connected in press-fit connection (connectors and connected parts between the PWB and the connectors) may be damaged. In view of this situation, a plug-in unit structured so as to protect the connector parts from an impact caused by, for example, a drop is demanded.

SUMMARY

According to an aspect of the invention, a plug-in unit includes a printed circuit board on which a connector is mounted and a cover in which the printed circuit board is accommodated. The cover allows the connector to be exposed when the plug-in unit is inserted into a housing and to be covered when the plug-in unit is in a standalone state in which the plug-in unit is not inserted into the housing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
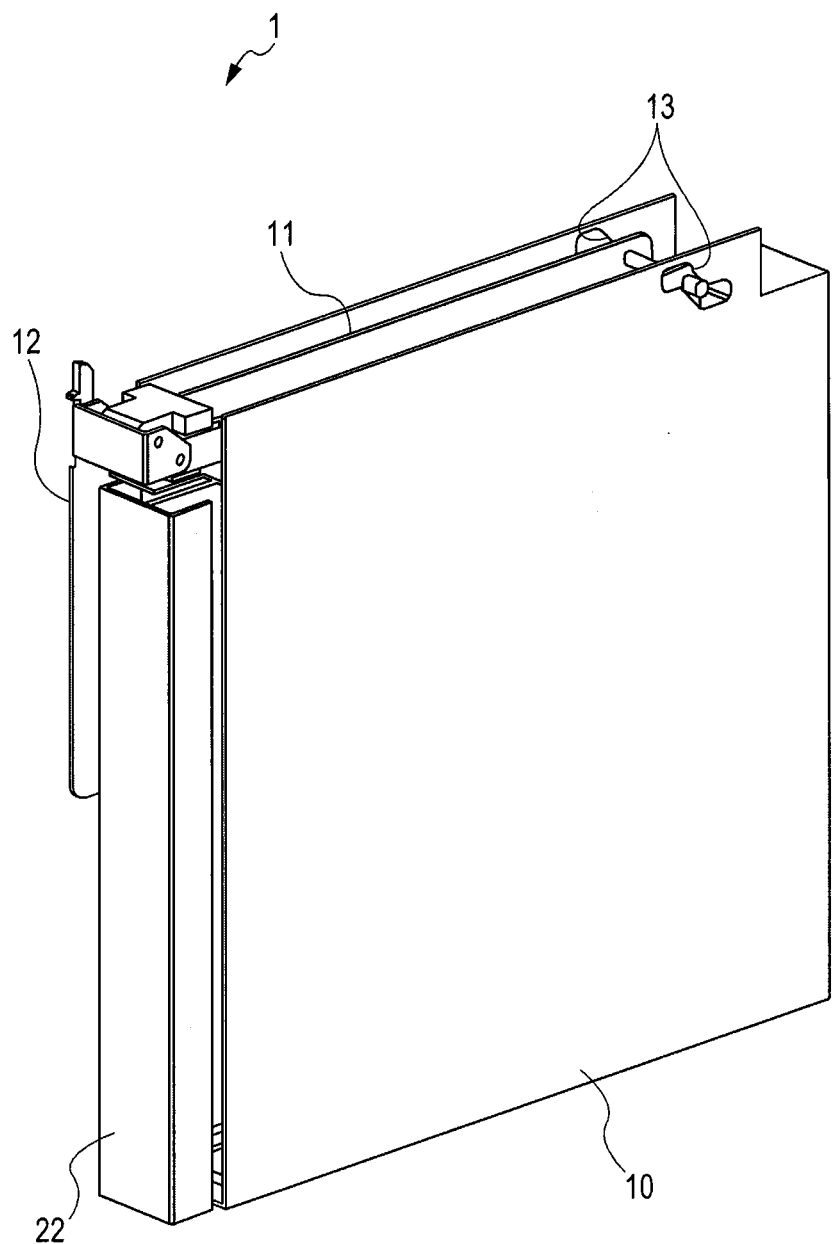
FIG. 1 illustrates an external view of a plug-in unit.
Figure 2:
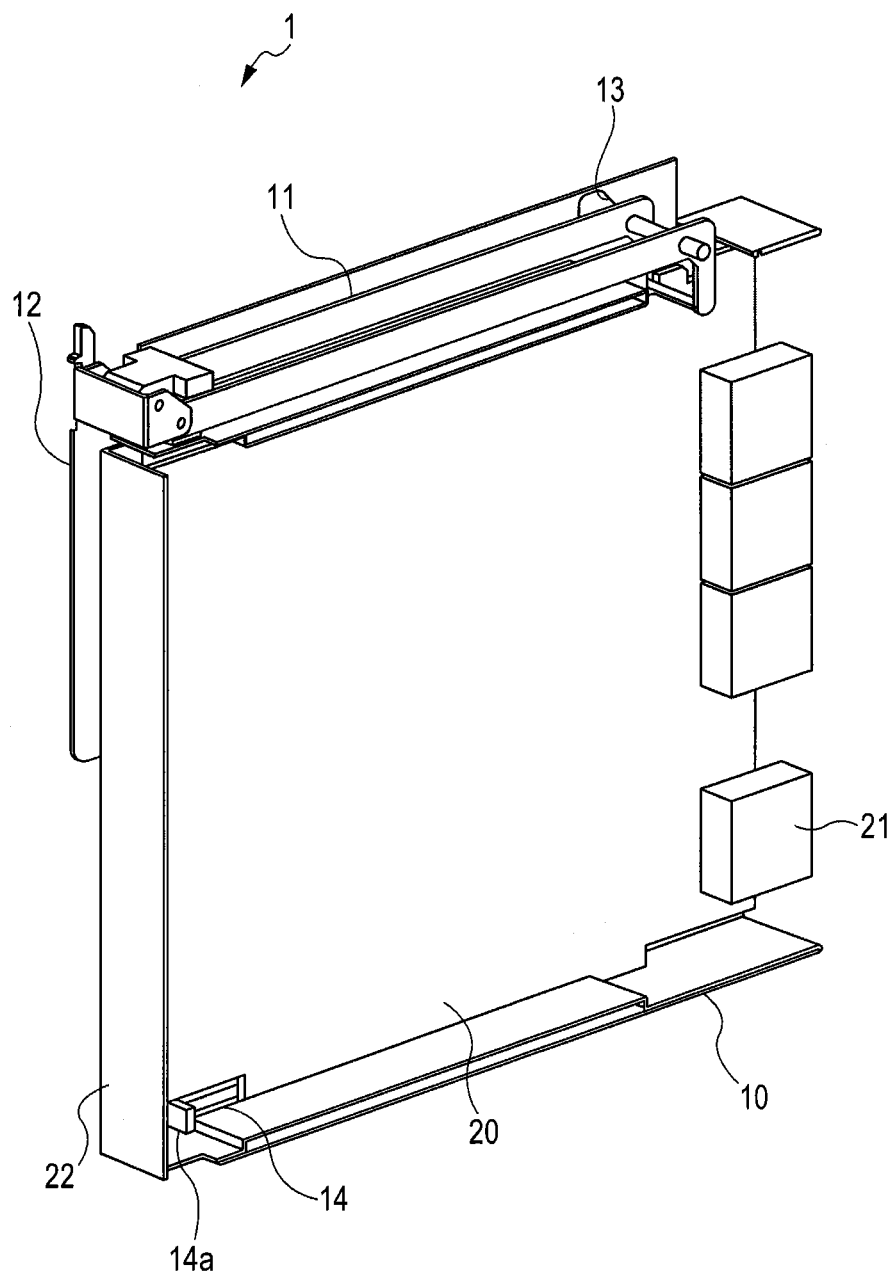
FIG. 2 illustrates the internal structure of the plug-in unit.
Figure 3:
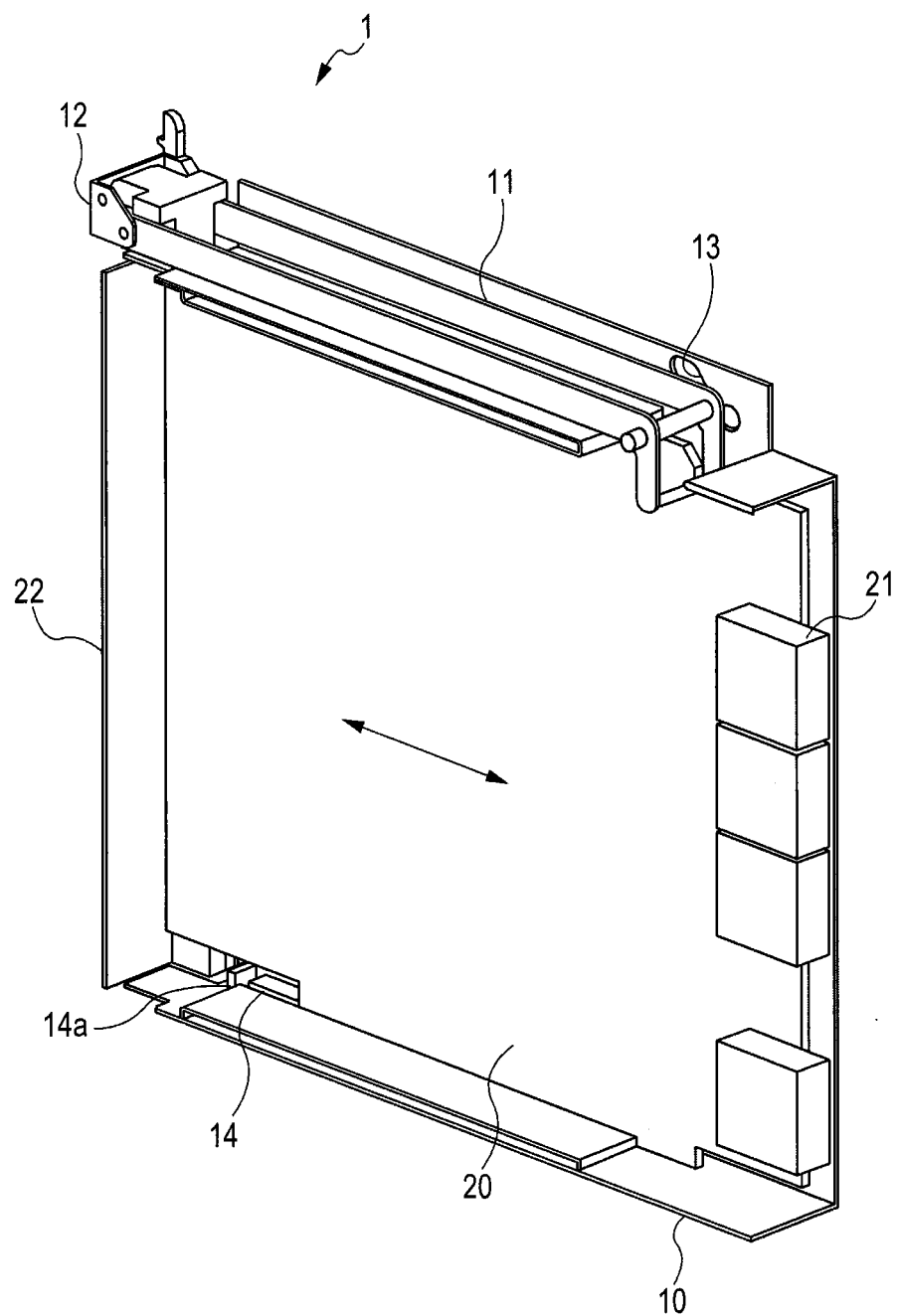
FIG. 3 also illustrates the internal structure of the plug-in unit.

An embodiment will be described below with reference to the drawings. FIG. 1 illustrates an external view of a plug-in unit 1, and FIGS. 2 and 3 illustrate the internal structure of the plug-in unit 1. The plug-in unit 1 includes a printed wiring board (PWB) 20 and a cover (referred to below as a shell) 10 in which the PWB 20 is accommodated.

A link bar 11 is provided on the top of the shell 10. A guide rail 13, which guides the link bar 11, has a hole on its side into which an end of the link bar 11 fits.

A card lever 12 is attached to the shell 10. The card lever 12 moves vertically by using an axis attached to the shell 10 as a rotational axis, and the end of the link bar 11 moves along the guide rail 13 in synchronization with the card lever 12, as described later.

PWB moving grooves 14 are formed on the inner upper and lower surfaces of the shell 10. A PWB stopper 14a is provided on at least either of the upper surface and lower surface. In the shell 10, the PWB 20 slides along the PWB moving grooves 14 in the directions indicated by the double arrow in FIG. 3.

In FIGS. 2 and 3, the link bar 11 seats in a groove, which will be described later, formed in the PWB 20 and the PWB 20 is positioned in the shell 10, suppressing the PWB 20 from sliding (an operation of the link bar 11 related to the groove will be described later).

A front panel 22 is fixed to the front end of the PWB 20, and PWB-side connectors 21, which are connected to a wiring board in the housing, are mounted on the rear end. The area of the shell 10 is large enough to cover the PWB 20 and PWB-side connectors 21.

Figure 4:
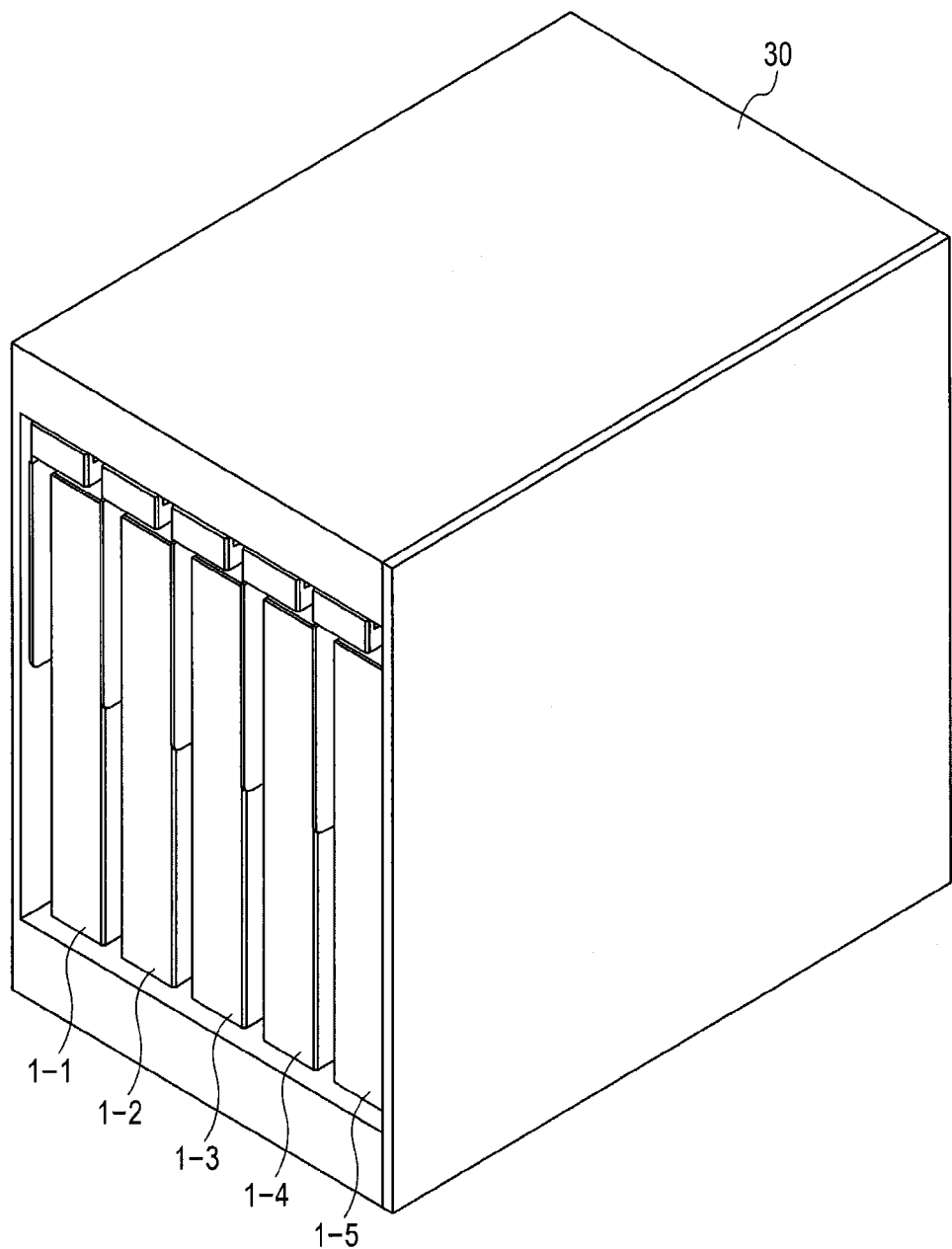
FIG. 4 illustrates a state in which plug-in units are inserted into a housing.

Next, a state in which plug-in units 1 are inserted into the housing (referred to below as a shelf) 30, as illustrated in FIG. 4, will be described. In FIG. 4, five plug-in units 1-1 to 1-5 are mounted in the shelf 30.

Although not illustrated in FIG. 4, the shelf 30 has a fan and a vent so that electronic parts mounted on the PWB 20 are cooled by the air blown by the fan.

With the plug-in unit 1 inserted into the shelf 30, the shelf 30 can be appropriately sealed by the front panel 22. Accordingly, it is possible to suppress the air blown by the fan from externally leaking and to cool the electronic parts in an efficient manner.

Figure 5:
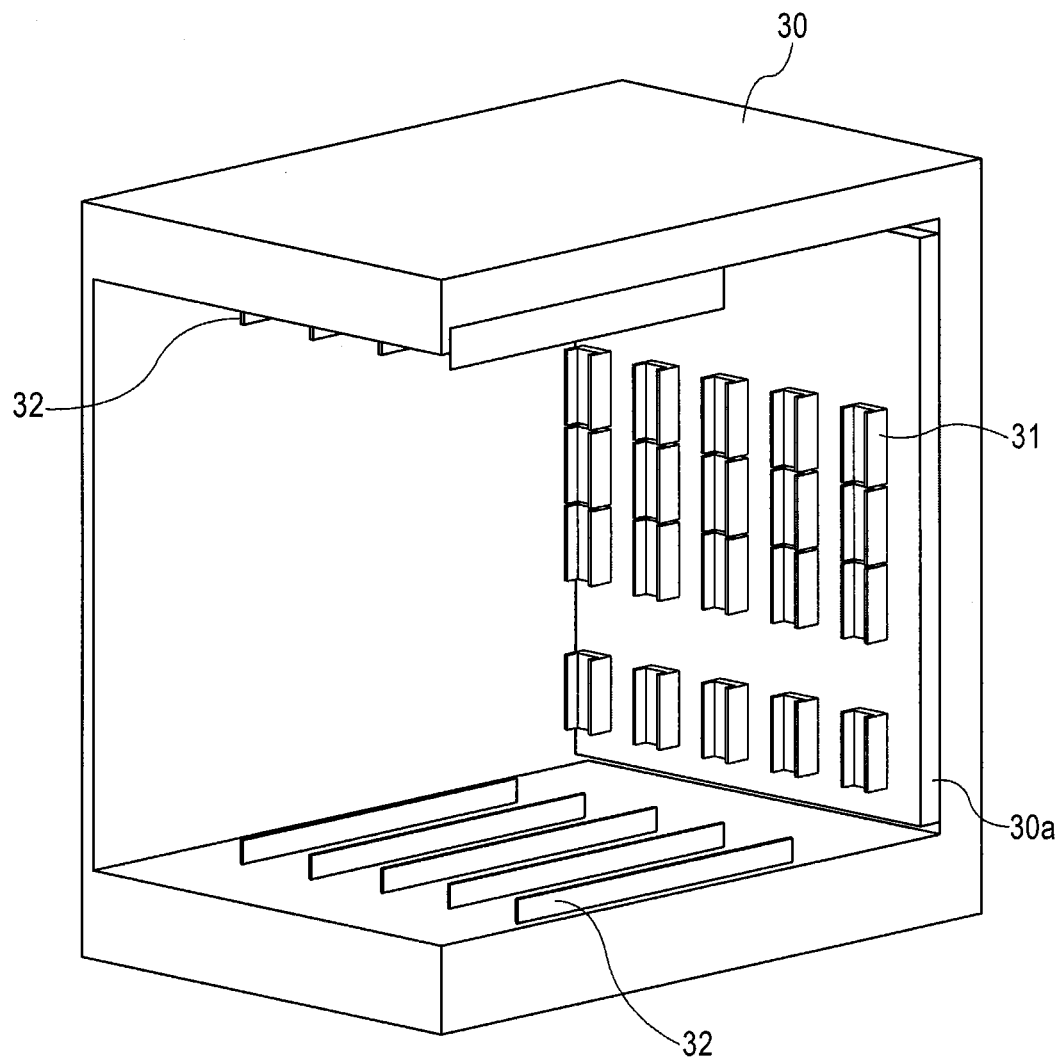
FIG. 5 illustrates the internal structure of a shelf.

FIG. 5 illustrates the internal structure of the shelf 30. Slot rails 32 are provided on the inner upper and lower surfaces of the shelf 30 so as to determine the insertion position of the plug-in unit 1. A back wiring board (BWB) 30a, which is a type of wiring board, is provided on a surface opposite to the surface from which plug-in units 1 are inserted. BWB-side connectors 31 are mounted on the BWB 30a.

The plug-in unit 1 is inserted into the shelf 30 by being slid along the slot rails 32. When the PWB-side connector 21 mounted on the PWB 20 fit to the relevant BWB-side connector 31 mounted on the BWB 30a, an electric connection is obtained.

Figure 6:
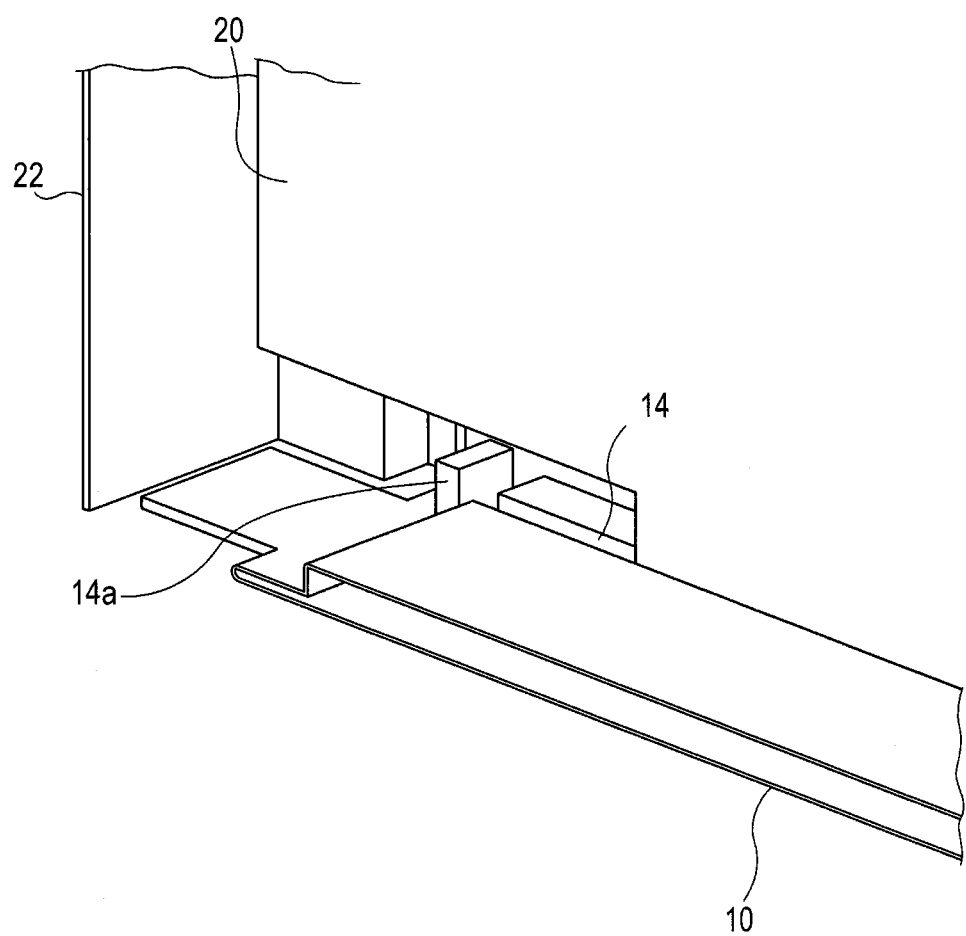
FIG. 6 illustrates a PWB stopper.

FIG. 6 illustrates a PWB stopper 14a. The shell 10 has PWB moving grooves 14, each of which has the PWB stopper 14a at one end.

Although the PWB 20 slides along the PWB moving grooves 14, since the PWB stopper 14a is provided, the sliding of the PWB 20 is restricted so as not to exceed the position of the PWB stopper 14a.

When the PWB stopper 14a is provided at an appropriate position, it is possible for the PWB 20 to slide only by a predetermined distance in the shell 10. An undesired play can also be suppressed.

Figure 7:
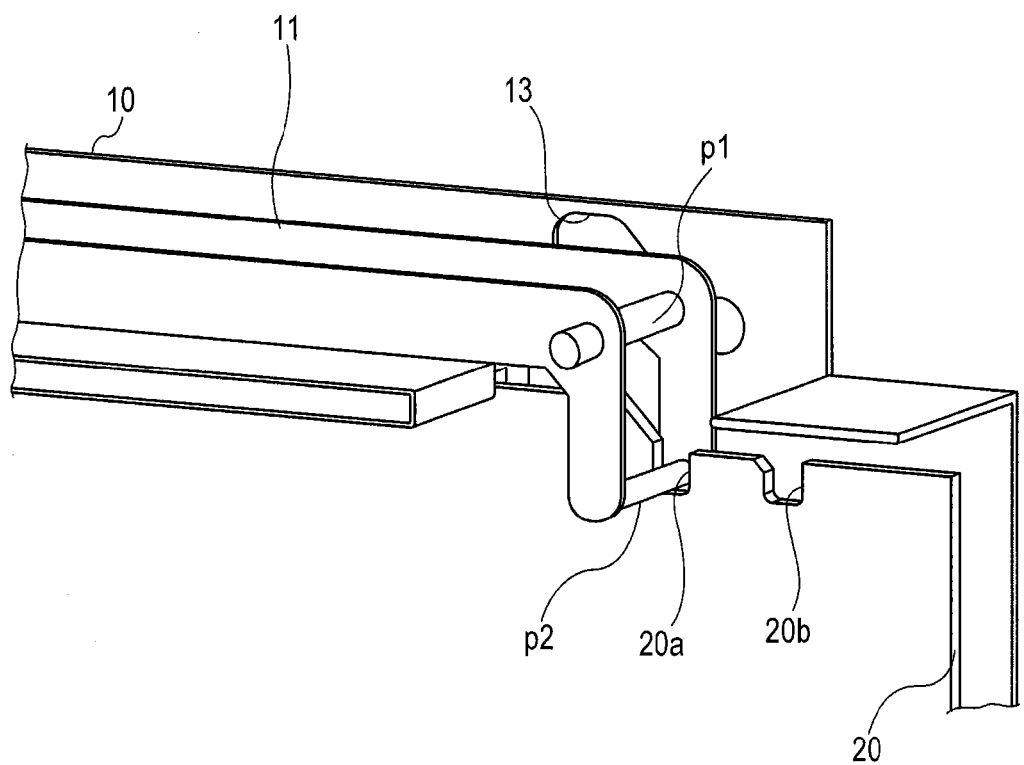
FIG. 7 illustrates positioning by a link bar.

How the PWB 20 is positioned in the shell 10 by the link bar 11 will be next described with reference to FIG. 7. Two grooves, groove 20a (first groove) and groove 20b (second groove), are formed at the upper end of the PWB 20. One end of the link bar 11 is bent at an angle, and a pin p1 and a pin p2 are provided at the bent portion.

With the pin p1 of the link bar 11 fitting into the hole in the guide rail 13, the link bar 11 is slid along the guide rail 13. The pin p2 of the link bar 11 fits into the groove 20a or groove 20b and engages the PWB 20, fixing the PWB 20 in the shell 10 and positioning the PWB 20 in the shell 10.

When the pin p2 of the link bar 11 fits into the groove 20a, the PWB-side connectors 21 fit to the BWB-side connectors 31. That is, the PWB-side connectors 21 are exposed from the shell 10. With the plug-in unit 1 inserted into the shelf 30, the pin p2 of the link bar 11 fits into the groove 20a.

When the pin p2 of the link bar 11 fits into the groove 20b, the PWB-side connectors 21 are retracted into the shell 10 and do not appear outside the shell 10. That is, the PWB-side connectors 21 are covered with the shell 10. When the plug-in unit 1 is in a standalone state (the plug-in unit 1 is not inserted into the shelf 30, for example), the pin p2 of the link bar 11 fits into the groove 20b.

With the pin p2 of the link bar 11 fitting into the groove 20b, the PWB-side connectors 21 are retracted into the shell 10 as described above, so the PWB-side connectors 21 are protected from an external impact caused when, for example, the plug-in unit 1 is dropped (this state is referred to below as the initial state). FIG. 7 illustrates a state in which the pin p2 fits into the groove 20a and the PWB-side connectors 21 are exposed from the shell 10.

Figure 8:
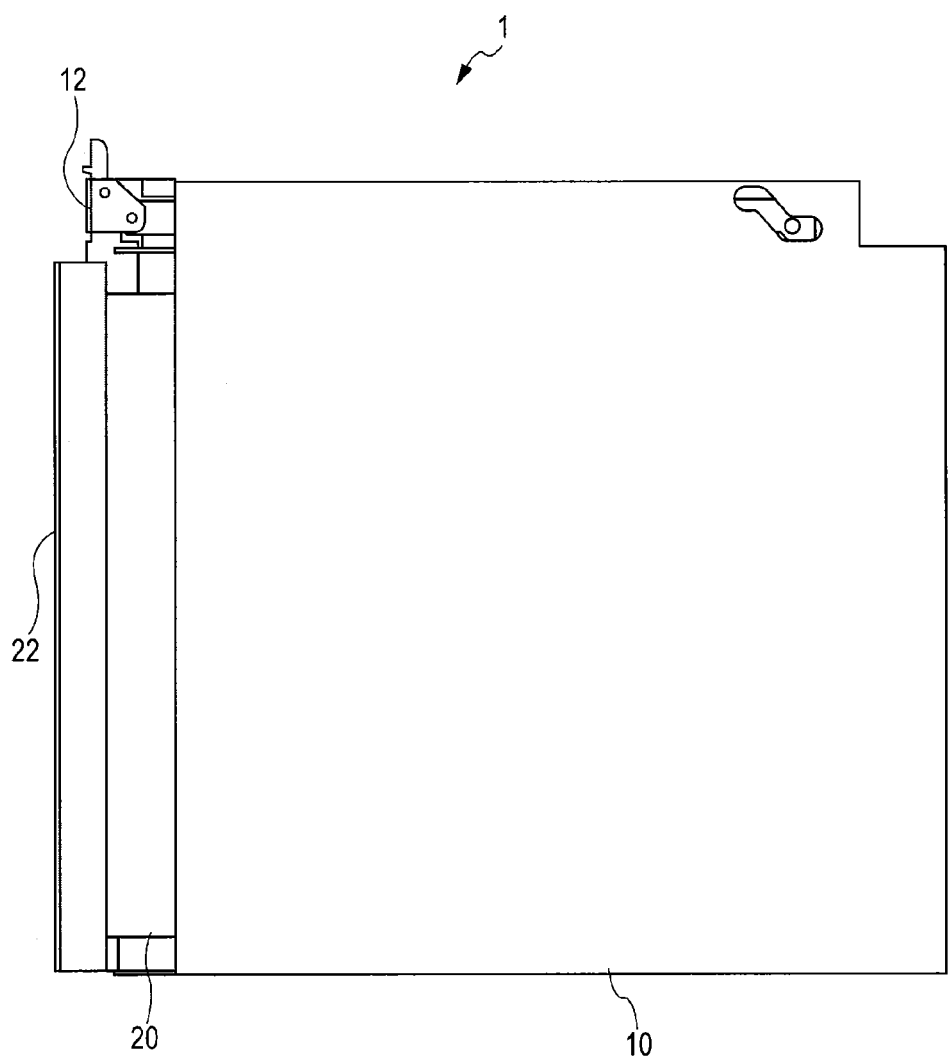
FIG. 8 illustrates an initial state of the plug-in unit.
Figure 9:
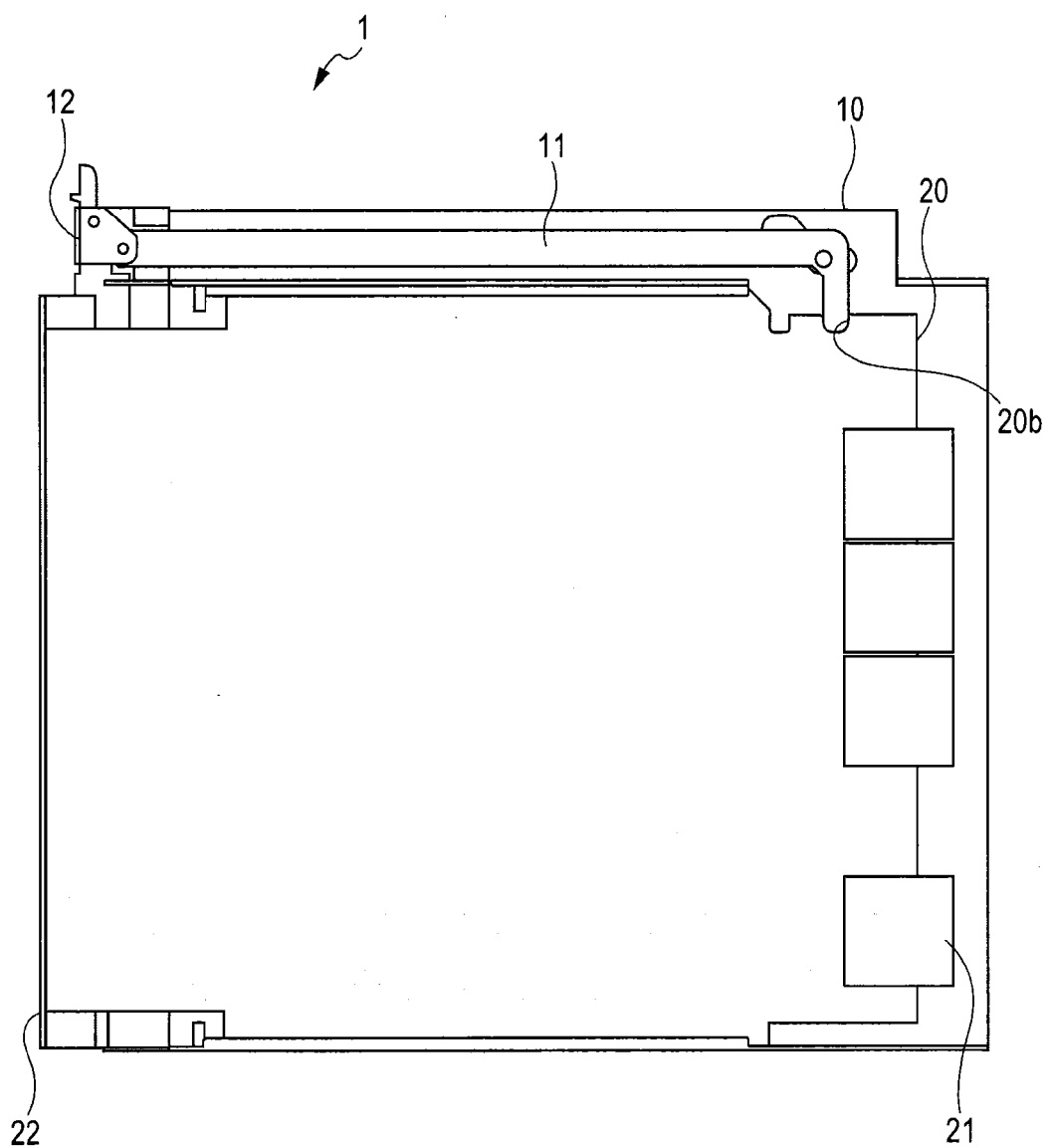
FIG. 9 also illustrates the initial state of the plug-in unit.

FIGS. 8 and 9 illustrate the initial state of the plug-in unit 1. FIG. 8 illustrates a side of the plug-in unit 1 in the initial state, and FIG. 9 illustrates the internal structure of the plug-in unit 1 in FIG. 8. Both FIGS. 8 and 9 illustrate a state in which the PWB-side connectors 21 is retracted into the shell 10 and is covered with the shell 10.

In FIG. 9, the pin p2 of the link bar 11 seats in the groove 20b, and the PWB 20 is positioned at a position that results in the PWB-side connectors 21 being covered with the shell 10.

In the initial state, the PWB-side connectors 21 to be fitted to the BWB-side connectors 31 are retracted into the shell 10 and covered with it in this way, so the PWB-side connectors 21 are not exposed to the outside and are thereby completely protected. Even if the plug-in unit 1 is dropped in this state, the shell 10 is first subject to an impact and a direct impact is not applied to the PWB-side connectors 21.

As described above, when the plug-in unit 1 is inserted into the shelf 30, the PWB-side connectors 21 are exposed. With the plug-in unit 1 being in the standalone state (the plug-in unit 1 is not inserted into the shelf 30, for example), the PWB-side connectors 21 are internally retracted and covered.

Accordingly, it becomes possible to protect the PWB-side connectors 21 and connector parts, which are connected parts between the PWB 20 and PWB-side connectors 21, from an impact caused when, for example, the plug-in unit 1 is dropped.

Next, an operation performed when the card lever 12 is manipulated will be described. The link bar 11 is linked to the card lever 12. When the card lever 12 is manipulated, the pin p2 of the link bar 11 fits into the groove 20a or groove 20b as described above.

Figure 10:
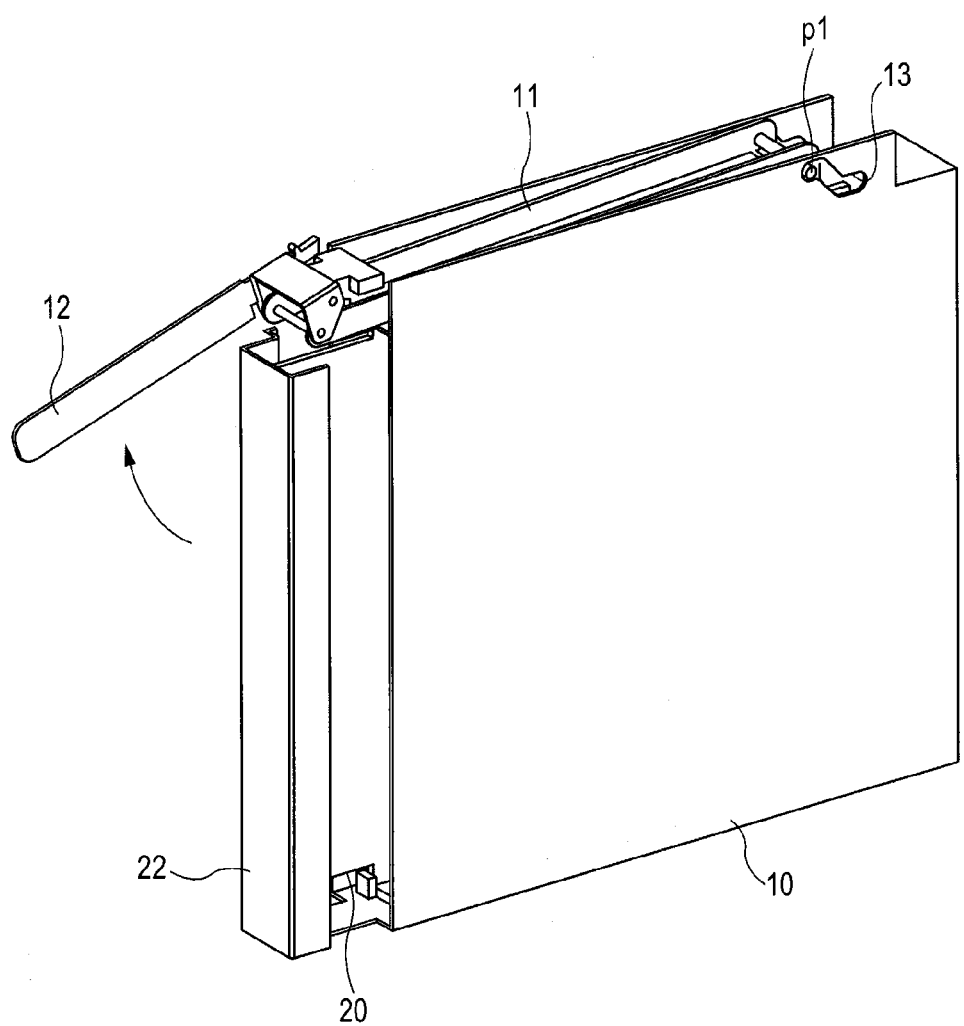
FIG. 10 illustrates a state in which the link bar is lifted by raising a card lever.
Figure 11:
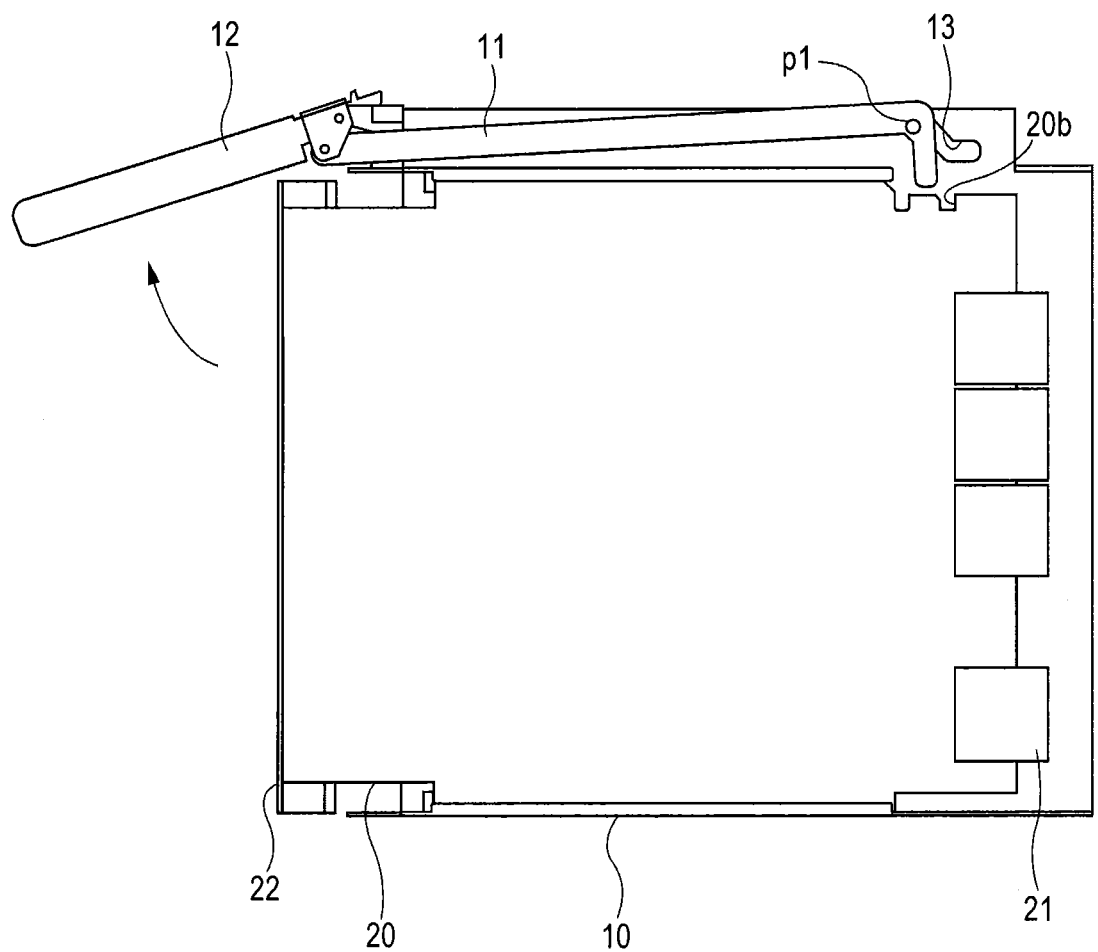
FIG. 11 also illustrates the state in which the link bar is lifted by raising a card lever.

FIG. 10 illustrates a state in which the link bar 11 is lifted by raising the card lever 12 with the plug-in unit 1 placed in the initial state. FIG. 11 illustrates the internal structure of the plug-in unit 1 in FIG. 10.

The link bar 11 is linked to the card lever 12 as described above, so when the card lever 12 is raised, the pin p1 of the link bar 11 is lifted along the guide rail 13 formed on a side of the shell 10, separating the pin p2 of the link bar 11 from the groove 20b.

Figure 12:
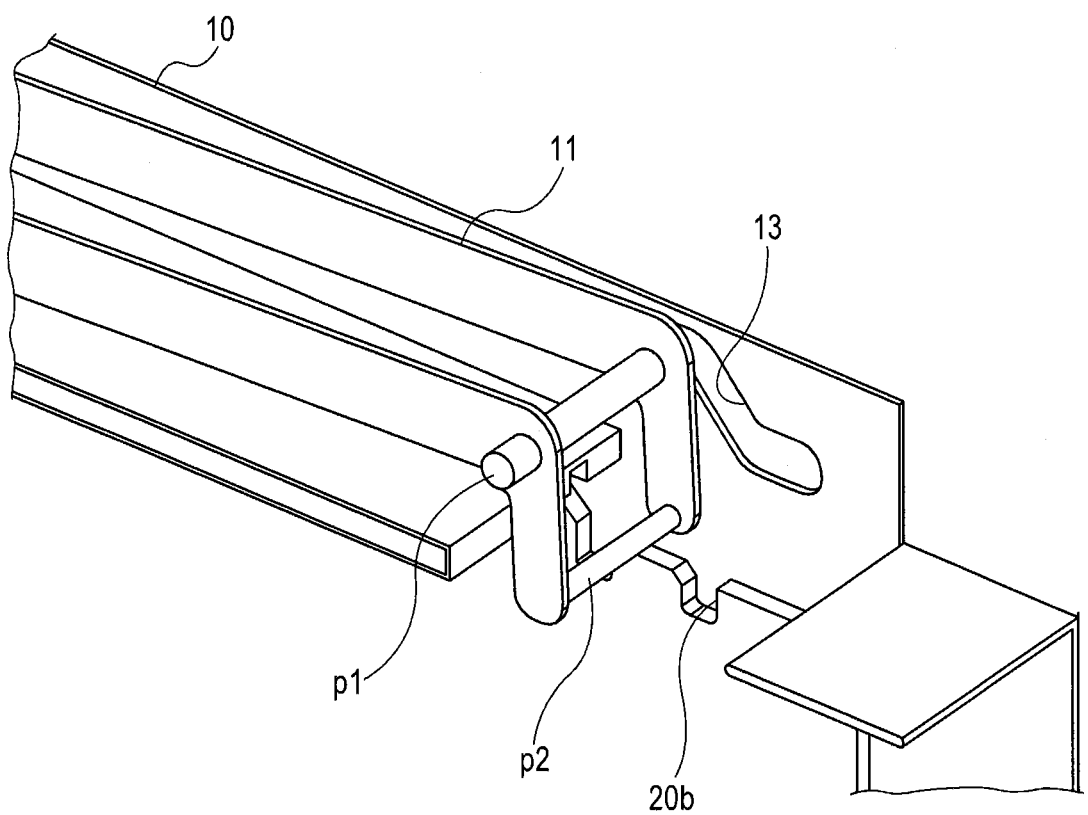
FIG. 12 illustrates a state in which the link bar is separated from a groove.

FIG. 12 illustrates a state in which the link bar 11 is separated from the groove 20b. When the card lever 12 is raised and the link bar 11 is lifted, the pin p1 of the link bar 11 is slid upward along the guide rail 13, separating the pin p2 of the link bar 11 from the groove 20b.

Figure 13:
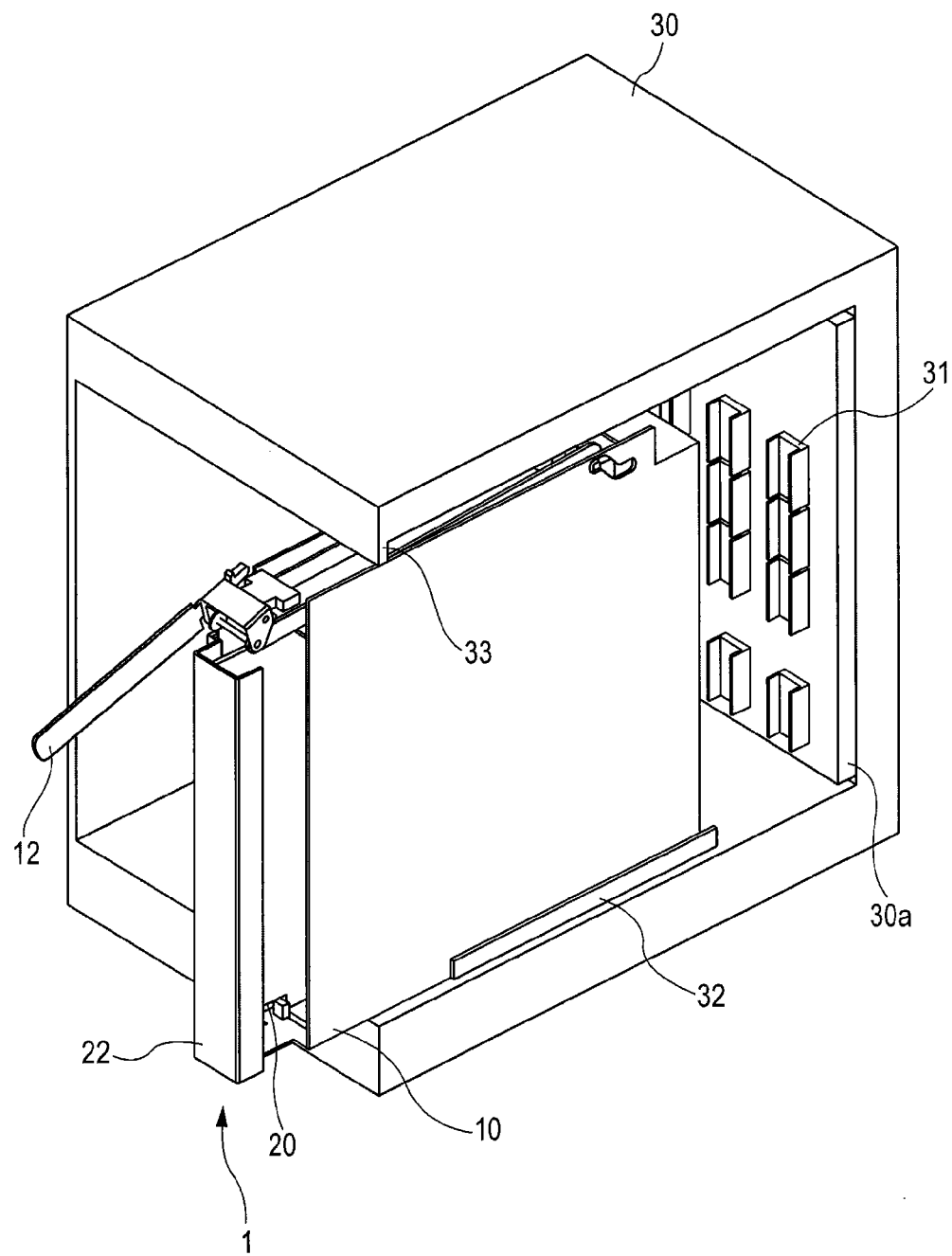
FIG. 13 illustrates a state when the plug-in unit is inserted into the shelf.
Figure 14:
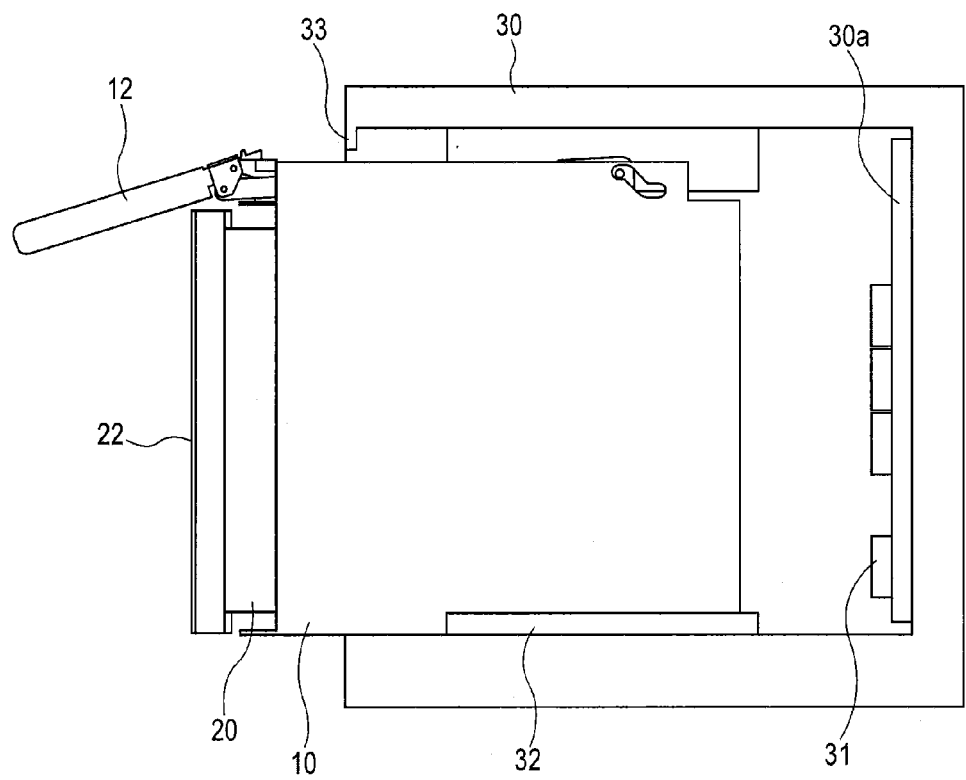
FIG. 14 also illustrates the state when the plug-in unit is inserted into the shelf.
Figure 15:
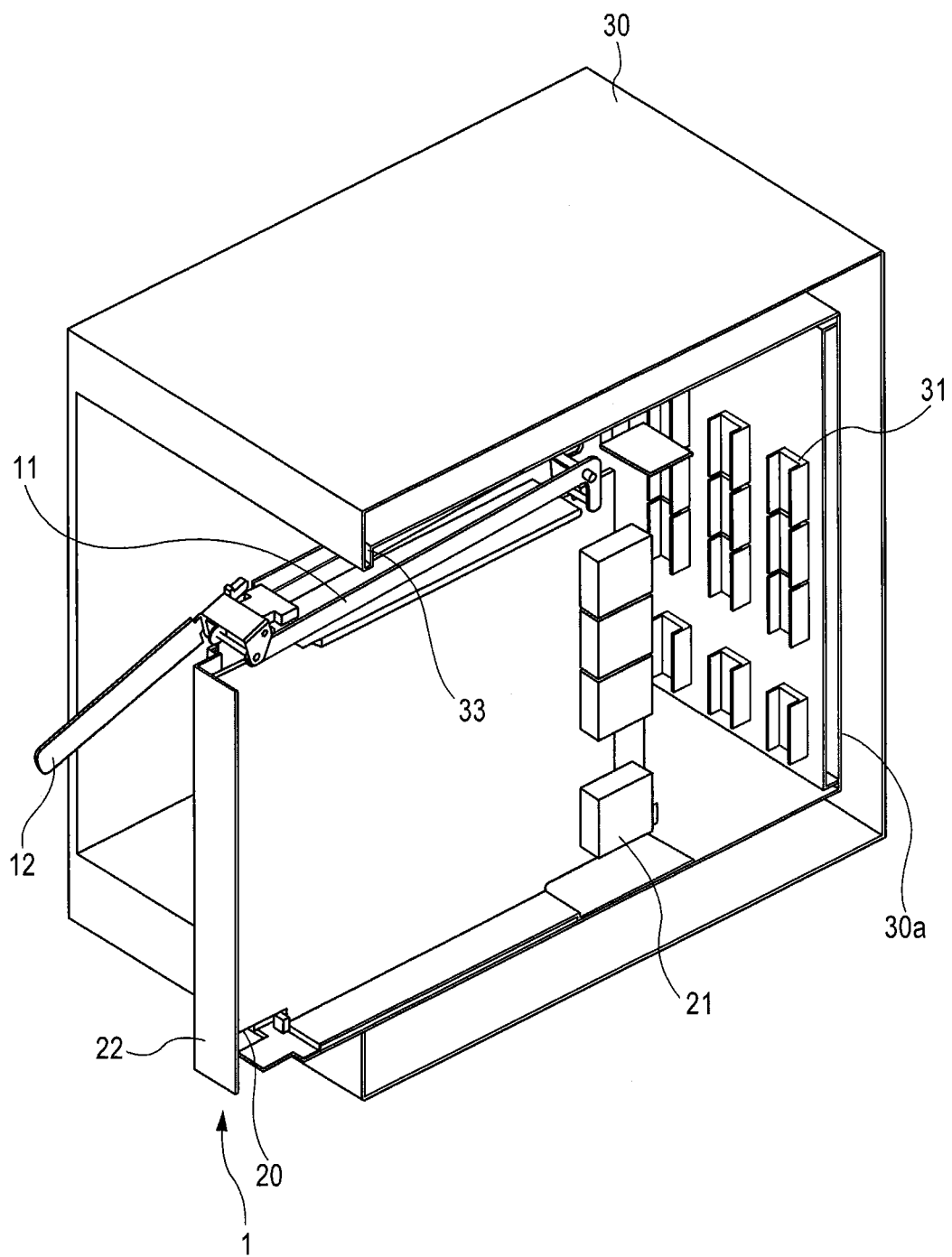
FIG. 15 also illustrates the state when the plug-in unit is inserted into the shelf.
Figure 16:
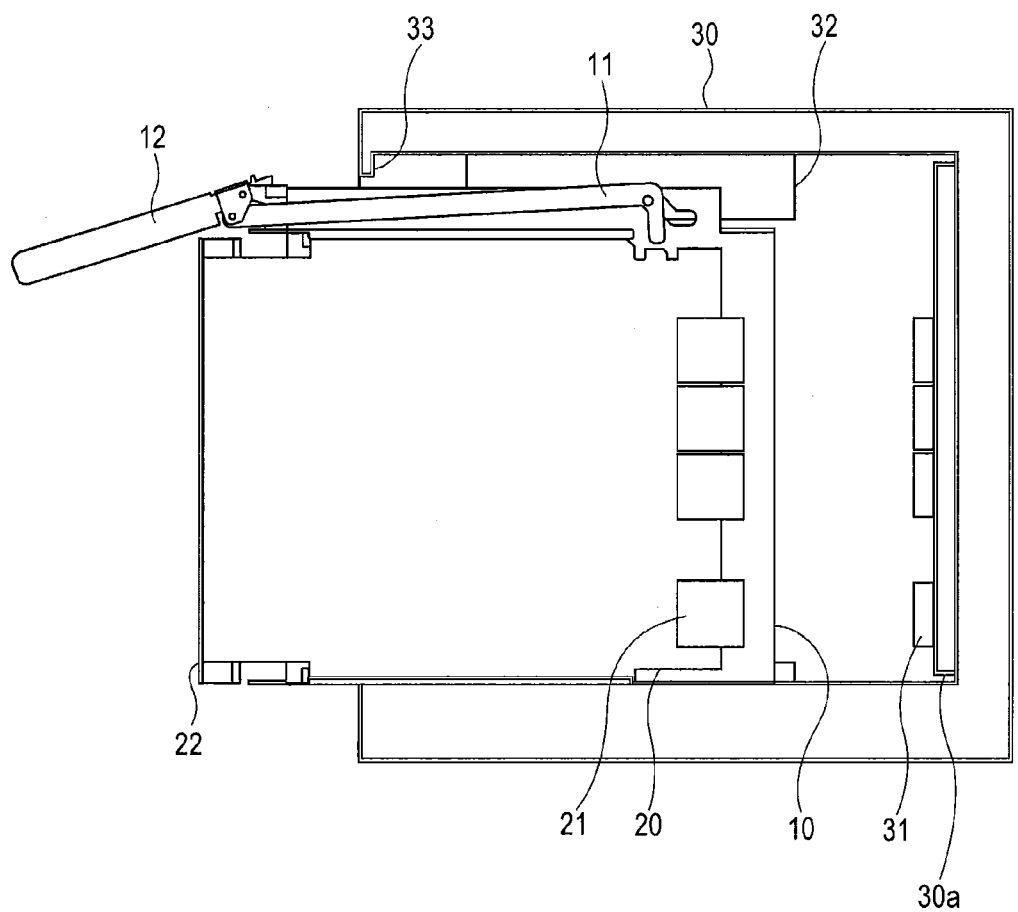
FIG. 16 also illustrates the state when the plug-in unit is inserted into the shelf.
Figure 17:
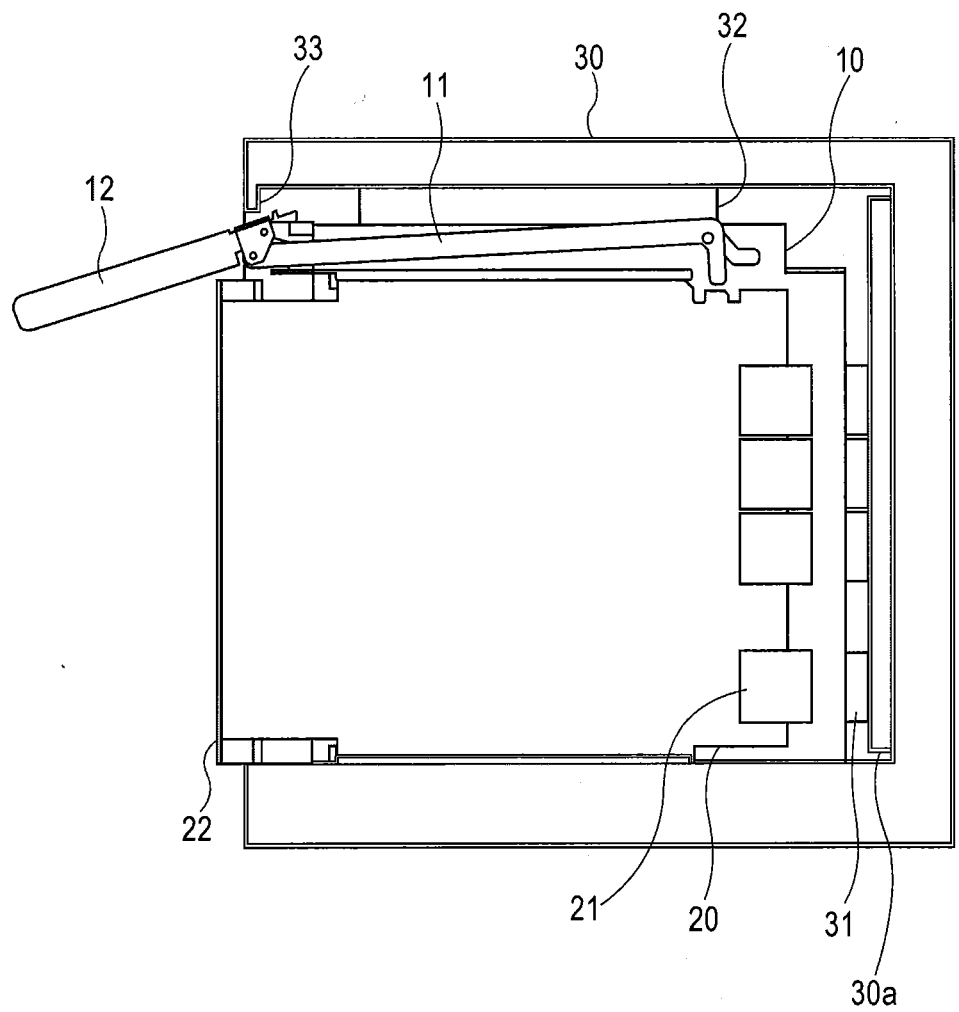
FIG. 17 illustrates another state when the plug-in unit is inserted into the shelf.

FIGS. 13 and 14 illustrate a state when the plug-in unit 1 is inserted into the shelf 30. FIGS. 15 to 18 illustrate the internal structure of the plug-in unit 1 when it is inserted into the shelf 30.

A protrusion (eaves) 33 is provided at each insertion port of the shelf 30, into which the plug-in unit 1 is inserted. When an attempt is made to insert the plug-in unit 1 into the shelf 30 with the plug-in unit 1 placed in the initial state, in which the card lever 12 is lowered, the card lever 12 hits the eaves 33, so the plug-in unit 1 fails to be inserted into the shelf 30.

Therefore, the card lever 12 is raised so that the card lever 12 does not hit the eaves 33 of the shelf 30 before the plug-in unit 1 is inserted into the shelf 30. The plug-in unit 1 is then inserted by being slid along the slot rails 32 provided in the shelf 30 toward the BWB 30a.

Figure 18:
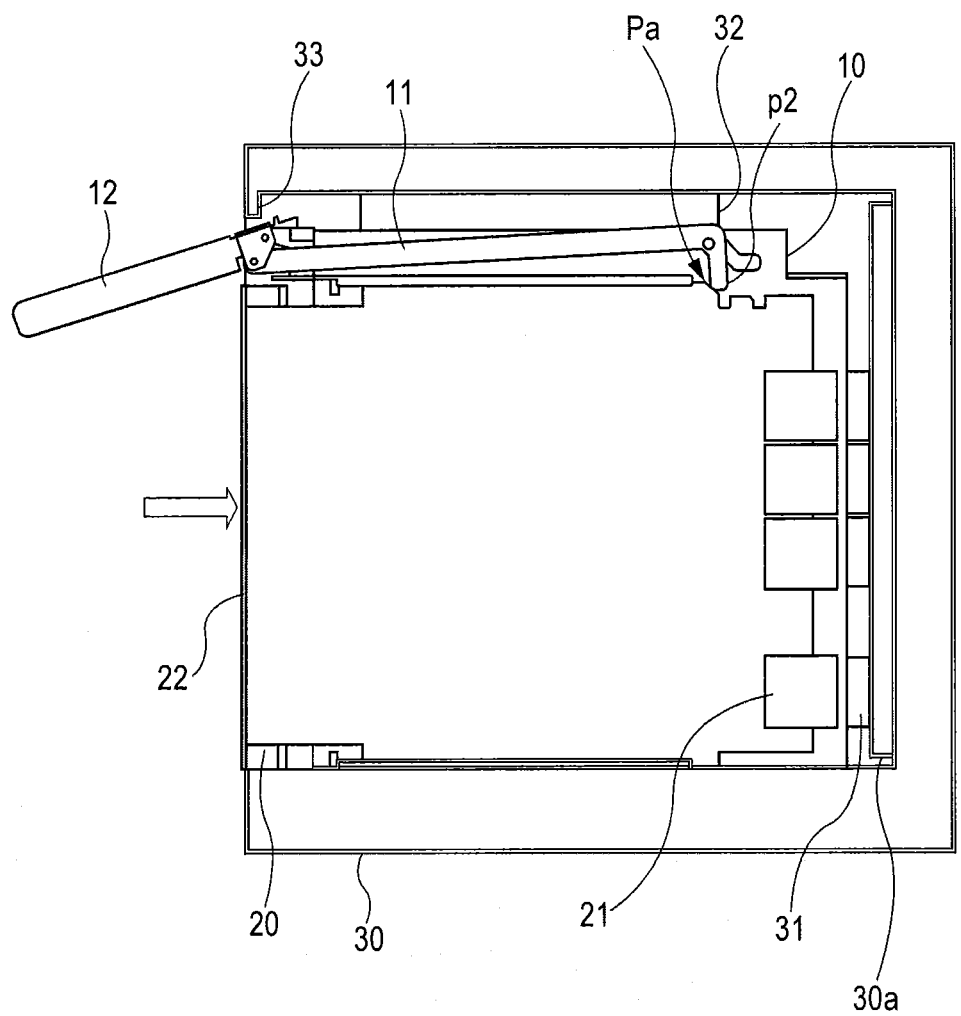
FIG. 18 also illustrates another state when the plug-in unit is inserted into the shelf.

FIG. 18 illustrates a state in which the front panel 22 is being pressed to move the PWB 20 in the shell 10 along the PWB moving grooves 14 toward the BWB 30a (in the insertion direction). Since the link bar 11 is raised, the PWB 20 can be moved in the shell 10. During the insertion of the plug-in unit 1 into the shelf 30, therefore, the PWB 20 can be moved to a position Pa, at which the pin p2 of the link bar 11 hits the PWB 20.

Figure 19:
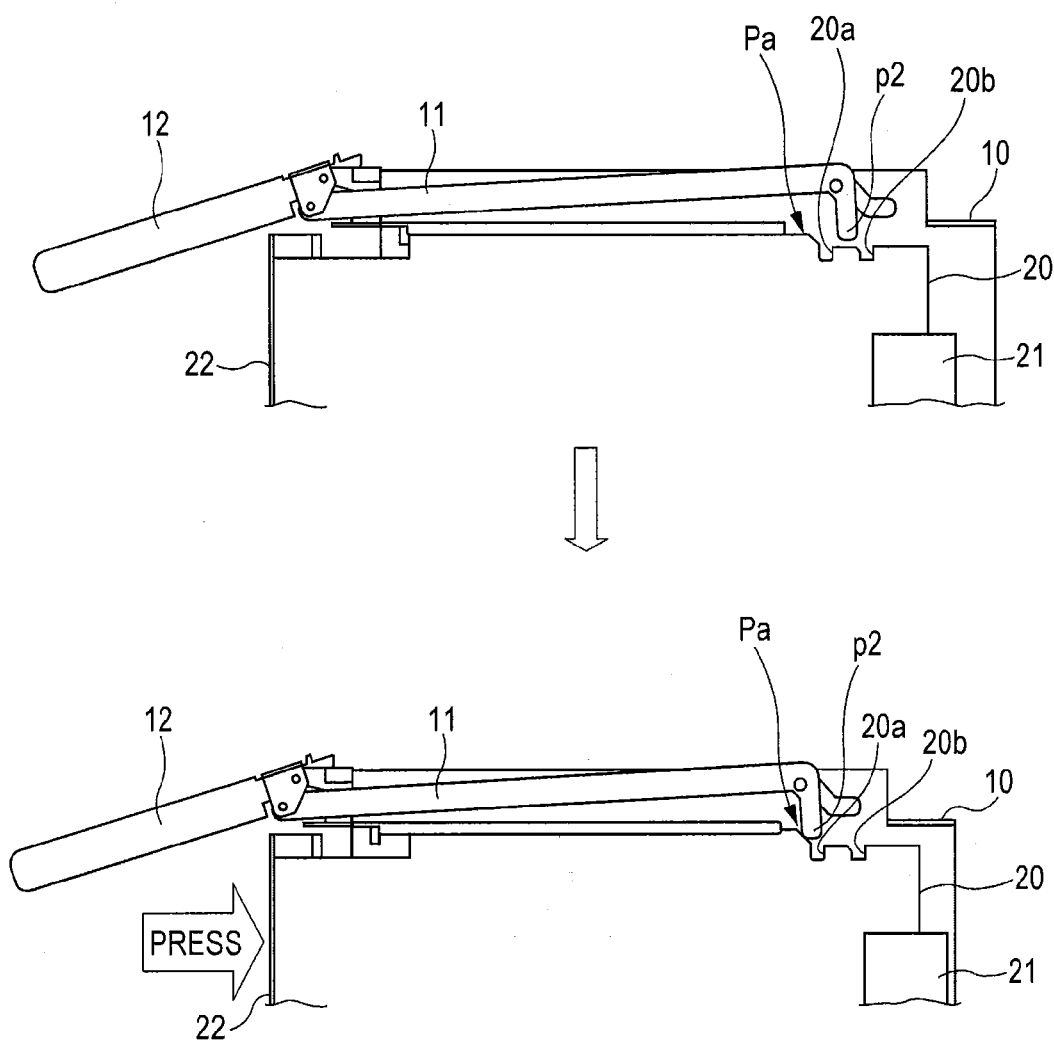
FIG. 19 illustrates the movement of the PWB in a shell.

FIG. 19 illustrates the movement of the PWB 20 in the shell 10. When the user presses the front panel 22 attached to the front end of the PWB 20, the PWB 20 moves along the PWB moving grooves 14 in the shell 10 in the insertion direction (to the right in FIG. 19).

Since the PWB 20 moves to the position Pa, at which the pin p2 of the link bar 11 hits the PWB 20, the position to which the pin p2 of the link bar 11 is lowered changes from the groove 20b to the groove 20a.

Conversely, although not illustrated, when the user pulls the front panel 22 attached to the front end of the PWB 20 with the link bar 11 separated from the PWB 20, the PWB 20 moves along the PWB moving grooves 14 in the shell 10 in a direction (to the left in FIG. 19) opposite to the insertion direction.

The PWB 20 then moves to a position at which the pin p2 of the link bar 11 fits into the groove 20b, the position at which the pin p2 of the link bar 11 fits changes from the groove 20a to the groove 20b.

Figure 20:
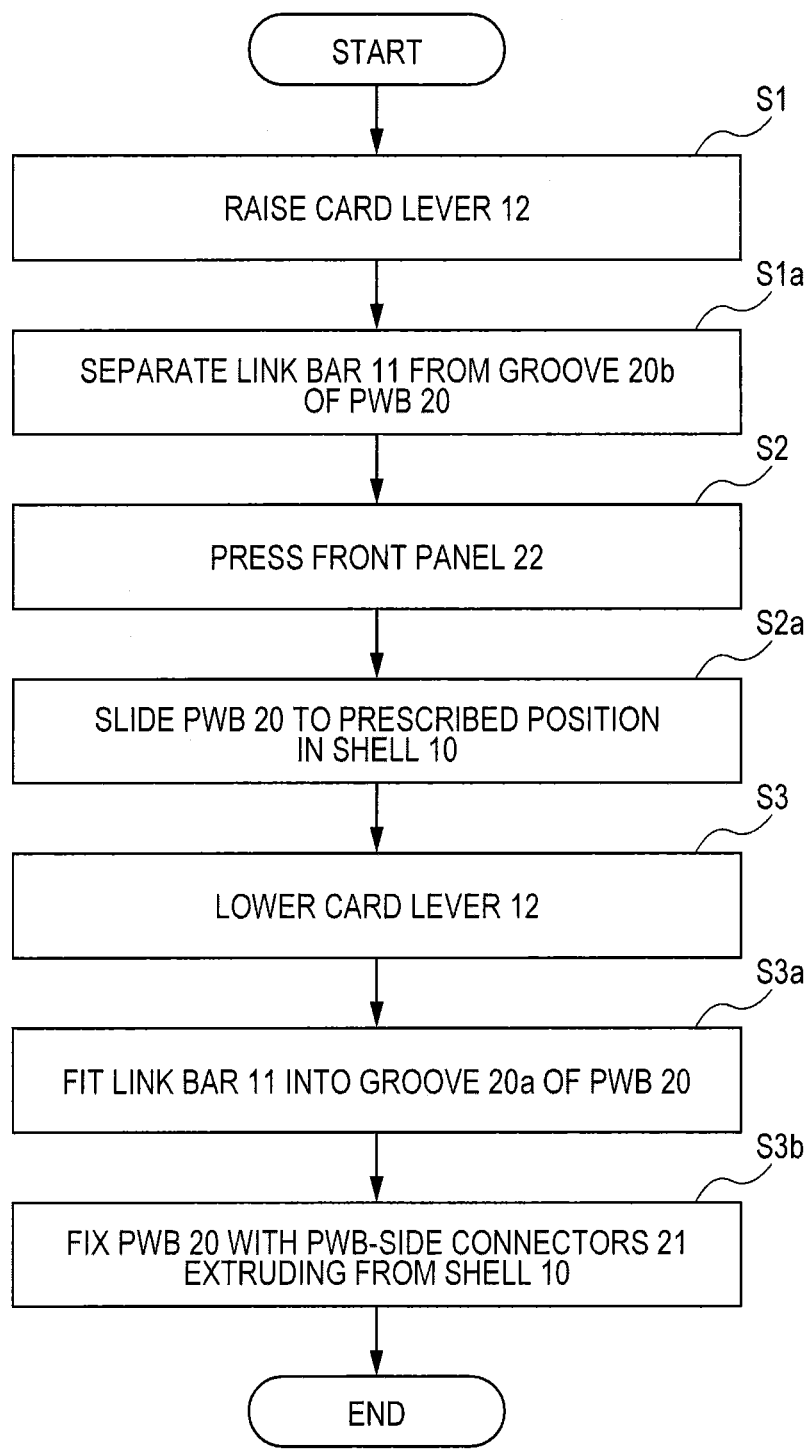
FIG. 20 is a flowchart illustrating an operation to protrude PWB-side connectors from the shell.

Next, flowcharts will be described. FIG. 20 is a flowchart illustrating an operation to protrude the PWB-side connectors 21 from the shell 10. The plug-in unit 1 is assumed to be first placed in the initial state.

S1: The user raises the card lever 12.

S1a: The link bar 11 slides upward along the guide rail 13 in synchronization with the card lever 12, and the end of the link bar 11 that has been fitted into the groove 20b of the PWB 20 is separated from the PWB 20.

S2: The user presses the front panel 22 of the PWB 20 to slide the PWB 20 in the shell 10.

S2a: The PWB 20 moves to the position Pa, at which the end of the link bar 11 hits the PWB 20.

S3: The user lowers the card lever 12.

S3a: The link bar 11 slides downward along the guide rail 13 in synchronization with the card lever 12, and the end of the link bar 11 fits into the groove 20a of the PWB 20.

S3b: The PWB 20 is fixed in the shell 10 with the PWB-side connectors 21 extruding from the shell 10.

Figure 21:
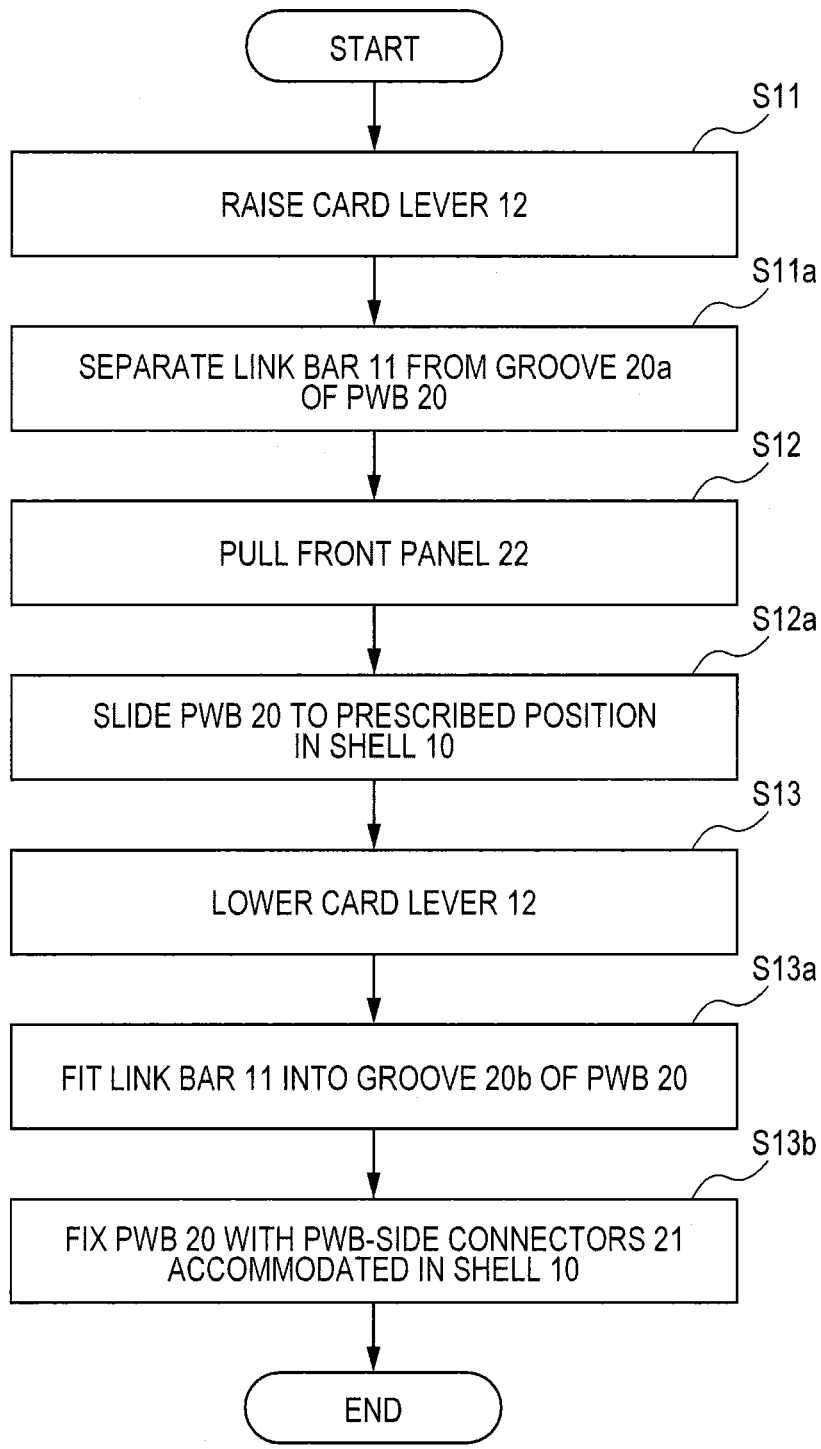
FIG. 21 is a flowchart illustrating an operation to retract the PWB-side connectors into the shell.

FIG. 21 is a flowchart illustrating an operation to retract the PWB-side connectors 21 into the shell 10. The plug-in unit 1 is assumed to be first placed in a state in which the PWB-side connectors 21 extrude from the shell 10.

S11: The user raises the card lever 12.

S11a: The link bar 11 slides upward along the guide rail 13 in synchronization with the card lever 12, and the end of the link bar 11 that has been fitted into the groove 20a of the PWB 20 is separated from the PWB 20.

S12: The user pulls the front panel 22 of the PWB 20 toward the user to slide the PWB 20 in the shell 10.

S12a: The PWB 20 moves to a position at which the end of the link bar 11 fits into the groove 20b.

S13: The user lowers the card lever 12.

S13a: The link bar 11 slides downward along the guide rail 13 in synchronization with the card lever 12, and the end of the link bar 11 fits into the groove 20b of the PWB 20.

S13b: The PWB 20 is fixed in the shell 10 with the PWB-side connectors 21 accommodated in the shell 10.

As described above, when the PWB 20 is slid in the shell 10, the position at which the link bar 11 fits is adjusted, after which when the card lever 12 is manipulated, the link bar 11 fits into a prescribed groove of the PWB 20 in synchronization with the card lever 12.

This mechanism enables the user to easily perform an operation by which the PWB-side connectors 21 extrude from the shell 10 or retract in the shell 10. With the plug-in unit 1 being in the standalone state, the PWB-side connectors 21 can be accommodated in the shell 10, so it becomes possible to protect the connector part from an external impact.

Figure 22:
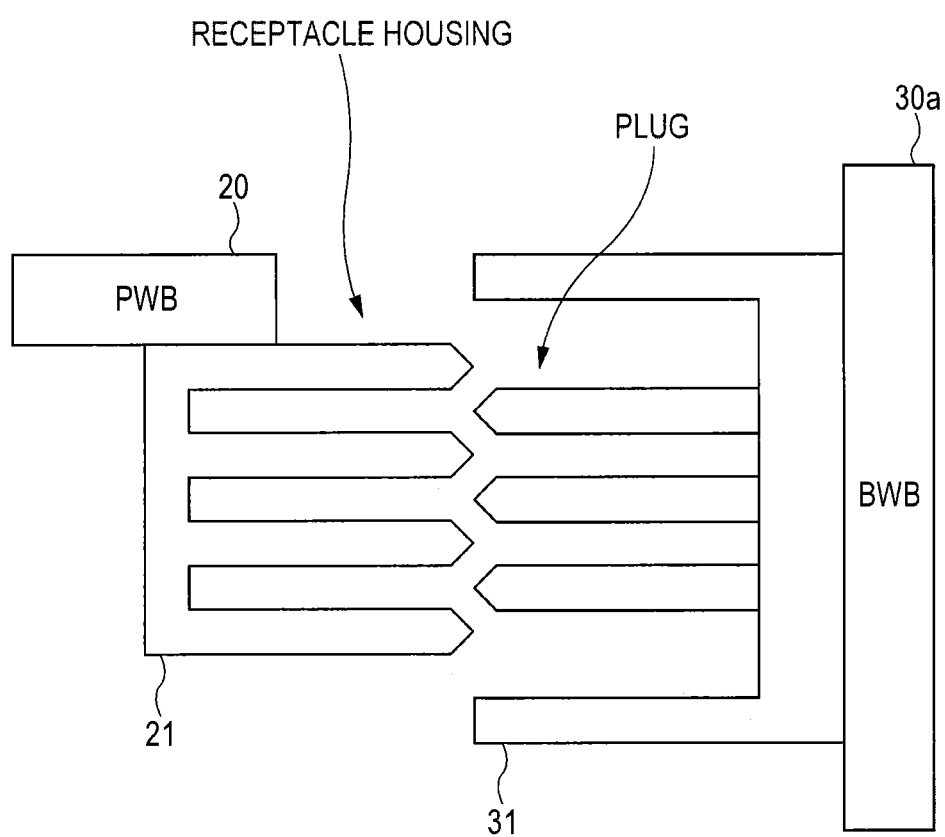
FIG. 22 illustrates a state before connectors are fitted.

Next, connector fitting during the insertion of the plug-in unit 1 in the shelf 30 will be described. FIG. 22 illustrates a state before connector fitting, that is, a state immediately before the PWB-side connector 21 is fitted to the BWB-side connector 31 during the insertion of the plug-in unit 1 into the shelf 30.

When the front panel 22 of the PWB 20 is pressed with a hand, the receptacle housing of the PWB-side connectors 21 enters the housing of the terminals (plugs) of the BWB-side connector 31. Since a strong force is used to fit the PWB-side connectors 21 to the BWB-side connectors 31, during the insertion of the plug-in unit 1 into the shelf 30, the card lever 12 is used to finally fit the PWB-side connectors 21 to the BWB-side connector 31.

Figure 23:
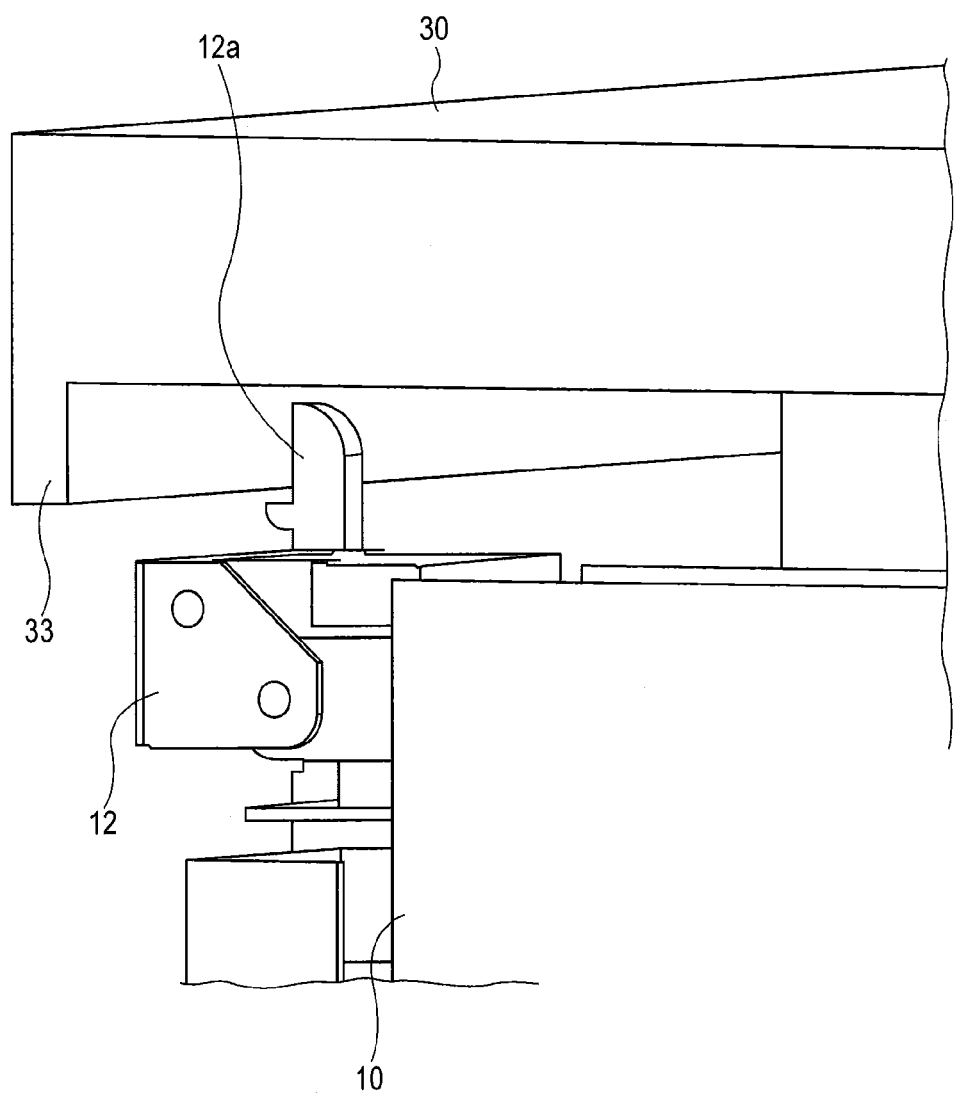
FIG. 23 illustrates the state of the card lever when the connectors are fitted.

FIG. 23 illustrates the state of the card lever 12 when the PWB-side connectors 21 are fit to the BWB-side connector 31. The plug-in unit 1 is inserted into the shelf 30 with the card lever 12 raised, after which the plug-in unit 1 is slid in the shelf 30 to the state, illustrated in FIG. 22, immediately before the PWB-side connectors 21 are fitted to the BWB-side connector 31.

When the card lever 12 is then lowered, the link bar 11 moves along the guide rail 13 and seats in the groove 20a. A protrusion 12a formed on the top of the card lever 12 hits the eaves 33 of the shelf 30, causing the eaves 33 to act as the fulcrum of a lever.

Figure 24:
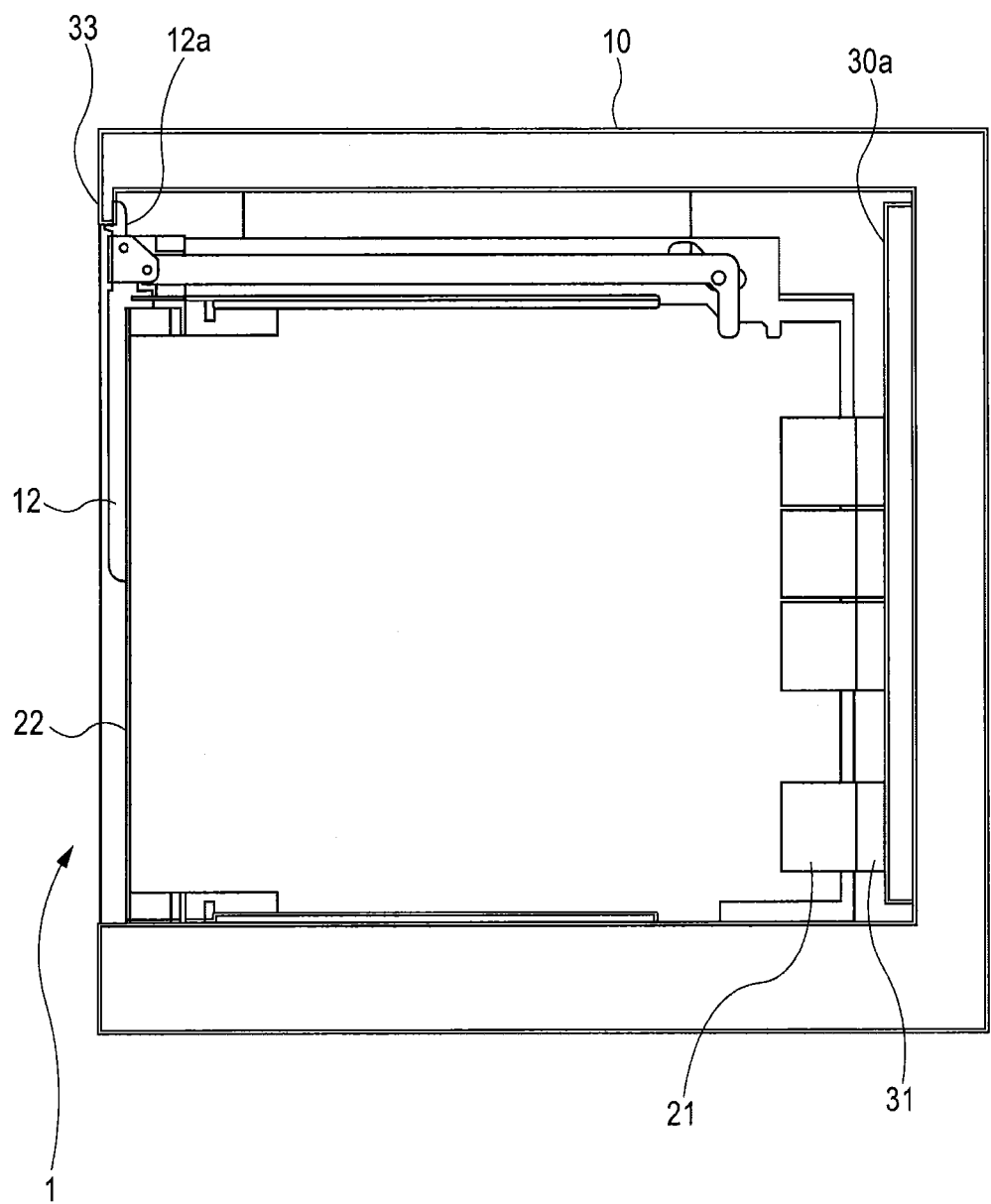
FIG. 24 illustrates a state in which the plug-in unit fits to the BWB.
Figure 25:
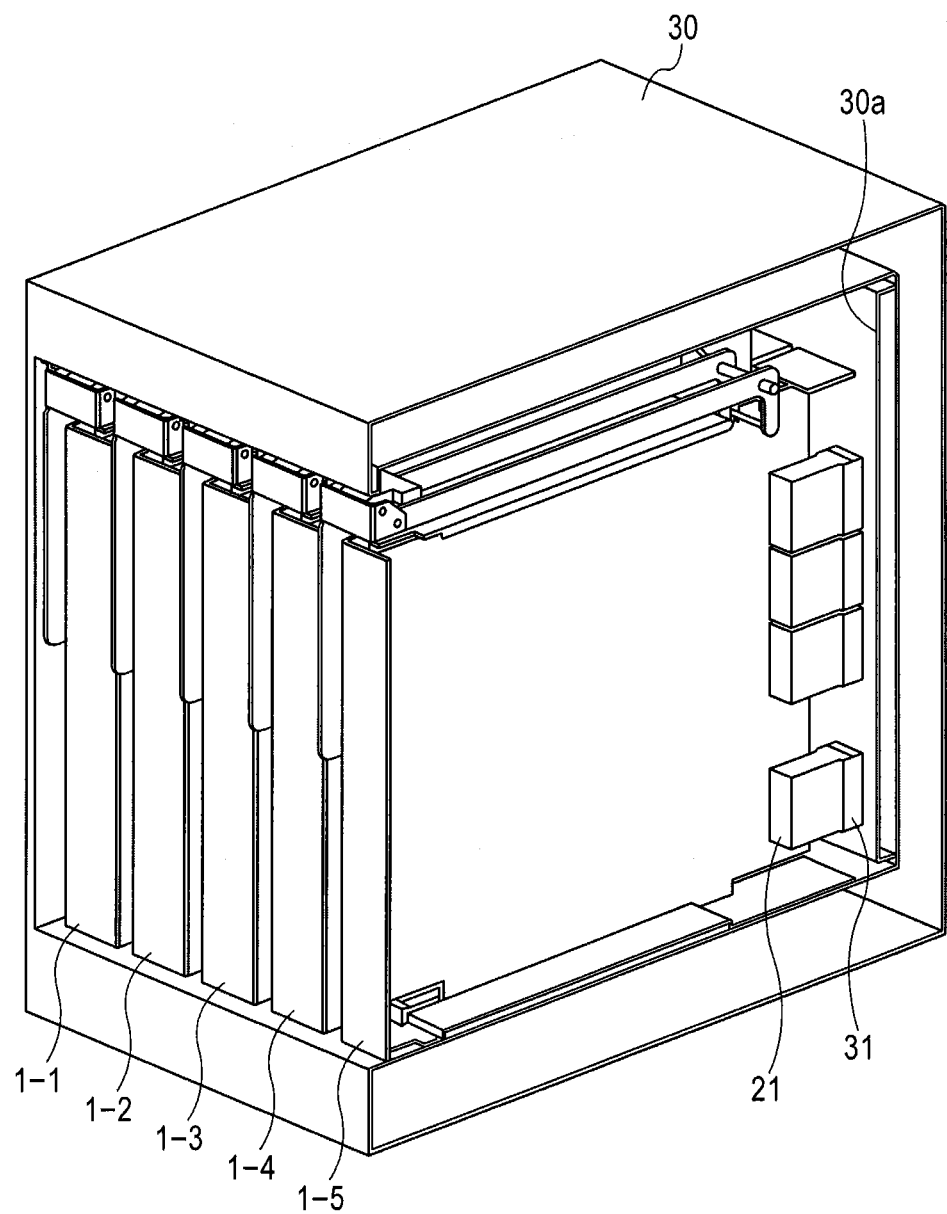
FIG. 25 illustrates a state in which plug-in units fit to the BWB.

When the card lever 12 is further lowered in this state, the entire plug-in unit 1 can be easily pressed toward the BWB 30a and the PWB-side connectors 21 can be completely fitted to the BWB-side connector 31 at the end. FIG. 24 illustrates a state in which the plug-in unit 1 fits to the BWB 30a, and FIG. 25 illustrates a state in which plug-in units 1 fit to the BWB 30a.

As described above, the plug-in unit 1 has the shell 10 in which the PWB 20, on which the PWB-side connectors 21 are mounted, is accommodated; the shell 10 is structured so that when the plug-in unit 1 has been inserted into the shelf 30, the PWB-side connectors 21 are exposed from the shell 10 and when the plug-in unit 1 is in the standalone state, the shell 10 covers the PWB-side connectors 21.

Accordingly, when the plug-in unit 1 drops, damage to the PWB-side connectors 21 can be suppressed. Furthermore, drop test standards demanded by users can be met and the ease with which the user handles the plug-in unit 1 can be improved.

This completes the description of the embodiment. However, the structure of each part can be replaced with another structure having a similar function, and desired structural components and processes may be added.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A plug-in unit comprising:
    a printed circuit board on which a connector is mounted, the printed circuit board including a first groove configured to position the printed circuit board in a first position in which the connector is exposed and a second groove configured to position the printed circuit board in a second position in which the connector is covered; and
    a cover in which the printed circuit board is accommodated, the cover including a link bar configured to fit into the first groove and the second groove such that when the plug-in unit is inserted into a housing, the link bar fits into the first groove, and when the plug-in unit is in a standalone state, the link bar fits into the second groove so that the cover covers the connector, the cover including a movement groove along which the printed circuit board slides to fit into the first groove and the second groove, a guide rail along which the link bar slides, and a card lever,
    wherein when the card lever is manipulated, the link bar slides along the guide rail in synchronization with the card lever and fits to the printed circuit board.

2. The plug-in unit according to claim 1, wherein:
    when the plug-in unit is inserted into the housing and the card lever is moved in one direction, the link lever that is fitted into the second groove slides along the guide rail and is separated from the printed circuit board;
    the printed circuit board slides along the movement groove in a direction in which the printed circuit board is inserted into the housing; and
    when the card lever is moved in another direction, the link bar slides along the guide rail and fits into the first groove.

3. The plug-in unit according to claim 1, wherein:
    when the plug-in unit is in the standalone state and the card lever is moved in one direction, the link lever that is fitted into the first groove slides along the guide rail and is separated from the printed circuit board;
    the printed circuit board slides along the movement groove in a direction opposite to the direction in which the printed circuit board is inserted into the housing; and
    when the card lever is moved in another direction, the link bar slides along the guide rail and fits into the second groove.

* * * * *